March 14, 1967 J. R. J. ST. LOUIS ETAL 3,309,579
MOUNTING ASSEMBLY FOR ELECTRICAL COMPONENTS
Filed March 10, 1965 2 Sheets-Sheet 1

INVENTORS
J.R.J. St. LOUIS
W. D. RUSSEL

AGENTS
Cumphey & Erickson

INVENTORS
J.R.J. St. LOUIS
W. D. RUSSEL
AGENTS
Curphey & Erickson

United States Patent Office 3,309,579

Patented Mar. 14, 1967

3,309,579

MOUNTING ASSEMBLY FOR ELECTRICAL COMPONENTS

Jacques Rodrigue Joseph St. Louis and William Delbert Russell, both of Ottawa, Ontario, Canada, assignors to Northern Electric Company Limited, Montreal, Quebec, Canada Filed Mar. 10, 1965, Ser. No. 438,673
7 Claims. (Cl. 317—101)

This invention relates to mounting assemblies for electrical components and more particularly to semi-conductor mounting assemblies and to a method of assembling the same.

It has been a common practice in the art to provide hermetic package assemblies for semiconductor devices. The prior art assemblies comprise a metal shell containing an insulation material. The electrode leads pass through the insulating material and are secured thereto. The leads sometimes serve as a mechanical support for the semiconductor device. A metal can is hermetically sealed to the shell and completely encloses the semiconductor assembly. However, since surface passivated semiconductor devices have come into existence, the need for a hermetic seal has been eliminated in some cases and a want for a less expensive mounting assembly has arisen.

In accordance with the invention, the proposed mounting assembly comprises a block of insulating material having at least one slot therein for receiving the leads of the device to be secured thereto. The slot has an entrance portion slightly greater in width than the diameter of the leads and an undercut portion wider than the entrance portion. Each lead is secured to the insulating material by laying it in the slot and by applying a localized pressure thereto to displace some of its material into the undercut portion. The slot need only be deep enough that there be enough lead material displaced into the undercut portion to secure the lead to the block of insulating material. The depth of the slot is preferably made greater than the radius of the lead but less than its diameter. A flat portion is formed on at least one of the leads to accommodate a semiconductor device. The flat portion may be formed by any suitable means but it is preferably done by using a suitable tool for applying pressure to secure the lead. To complete the assembly, the semiconductor device is bonded to the one lead and the necessary connections are made to the other leads. The whole assembly is then finally encapsulated with a suitable potting material.

The above described mounting assembly is inexpensive to manufacture because of the simplicity of the process for attaching the leads to the insulator and for securing the semiconductor body to the assembly.

Another advantage of the above described assembly is that the semiconductor device is mounted directly on the lead which acts as a heat sink and therefore improves the thermal dissipation capability of the devices over that of conventional mountings.

A further advantage of the above described assembly is that it simplifies the wire bonding operation because the small wires interconnecting the semiconductor devices and the leads may be tacked anywhere on the flat portions of the leads.

Preferred embodiments of the invention will now be described with reference to the accompanying drawings in which.

Figure 1:
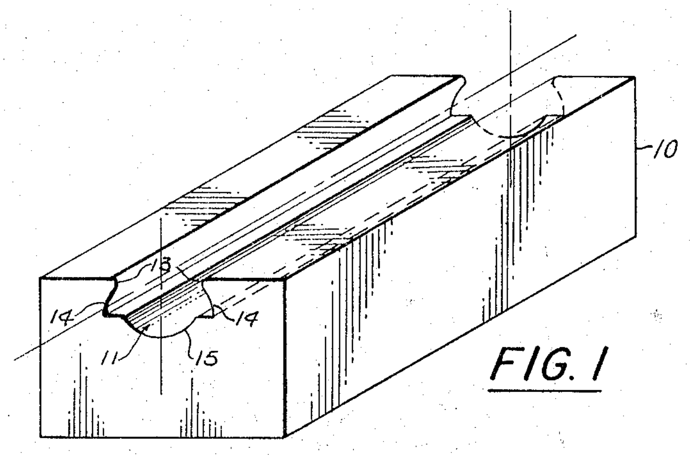
FIG. 1 is a perspective view of a block of insulating material having a slot therein for receiving the leads in accordance with the present invention.
Figure 2:
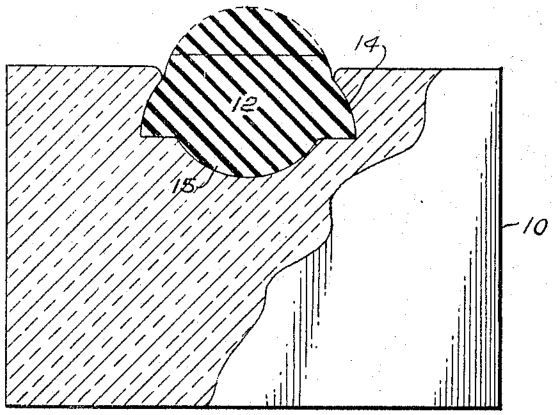
FIG. 2 is a sectional view of a block of insulating material showing a press-fitted lead secured thereto.

Referring to FIGURES 1 and 2 there is shown a block of insulating material 10 having a slot 11 adapted to receive therein a lead 12 to be secured to the block. Slot 11 has an entrance portion 13 slightly greater in width than the diameter of the lead 12, and has an undercut portion 14 wider than the entrance portion 13. The lead is secured to insulator 10 by laying it into slot 11 and by applying a localized pressure thereto to displace some of its material into the undercut portion 14 of the slot 11. The slot 11 need only be deep enough that there be enough material displaced into the undercut portion to secure the lead to the block of insulating material. In the drawings the depth of the slot is shown as being greater than the radius of the lead but less than its diameter. The lower portion 15 of slot 11 conforms to the shape of the lead so as to minimize the tensile stresses set up in the insualtor 10 during the compressive displacement of the lead material.

Figure 3:
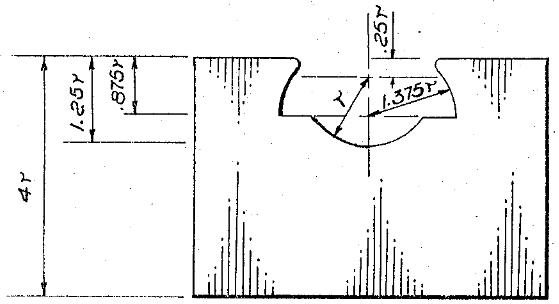
FIG. 3 illustrates the approximate slot dimensions for a preferred block of insulating material.

The figures of drawings have been greatly enlarged. FIGURE 3 of the drawings illustrates the preferred dimensions of the insulating block which is used for a diode assembly. The dimensions are a function of *r*, the radius of the wire lead. As illustrated, the depth of the slot is 1.25*r*; the radius of the undercut portion is 1.375*r*; the width of the block is 6*r* and its thickness 4*r*. The length of the block (not shown) is 9*r*.

Figure 4:
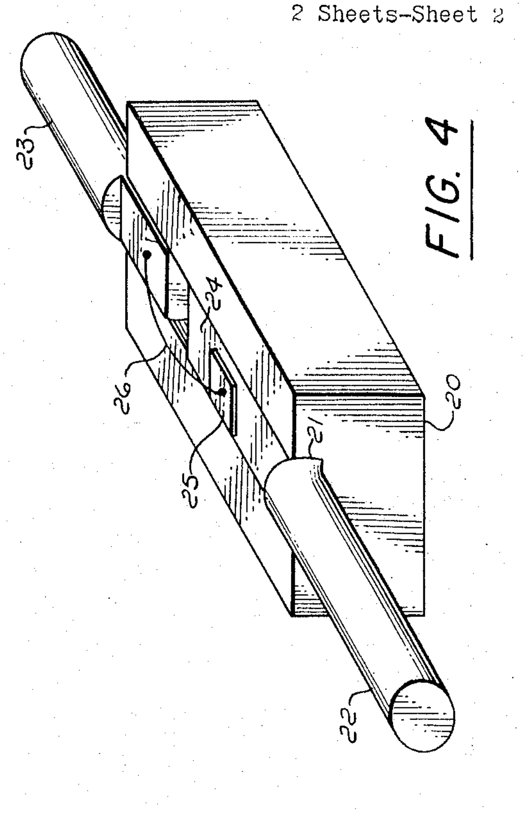
FIG. 4 illustrates a diode assembly.

IN FIGURE 4 there is a shown a diode assembly comprising a block of insulating material 20 having a slot 21 identical to slot 11 of FIGURE 1. Electrode leads 22 and 23 are secured in opposite ends of slot 21, and spaced from each other, using the process described in connection with FIGURES 1 and 2. In securing leads 22 and 23 to block 20 a flat portion 24 is formed on each lead. A diode chip 25 is bonded to flat portion 24 of lead 22 and a gold lead 25 completes the connection from diode 25 to the flat portion of lead 23. The insulating material may be ceramic or other material capable of withstanding the temperatures at which connections from the semiconductor wafer to the other lead are effected.

Figure 5:
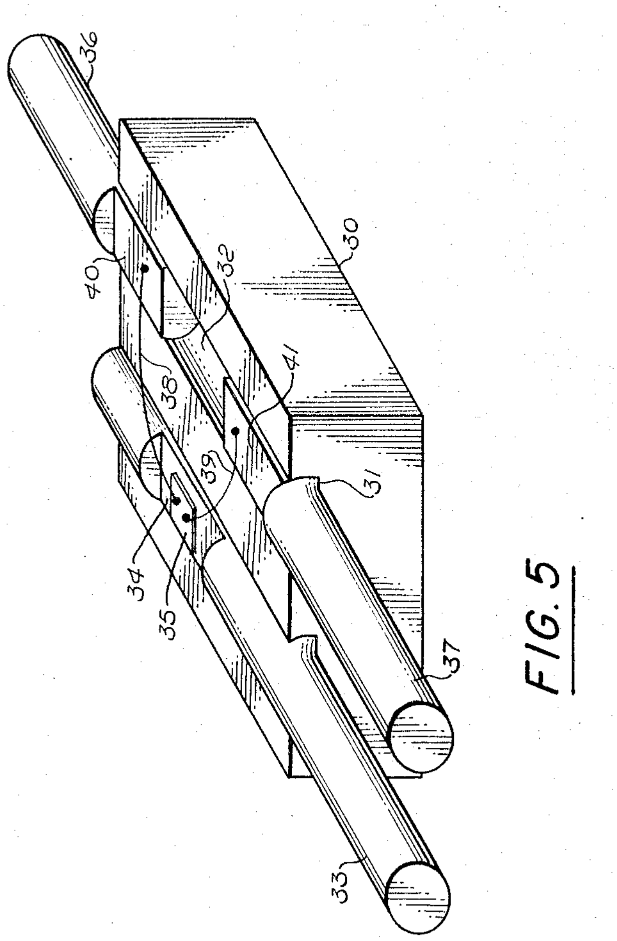
FIG. 5 illustrates a transistor assembly.

FIGURE 5 illustrates a transistor assembly comprising a block of insulating material 30 having slots 31 and 32. A collector lead 33 is secured in slot 31. Lead 33 has a flat portion 34 on which is bonded wafer 35. Base and emitter leads 36 and 37 are secured in opposite ends of slot 32 in spaced relation. Gold leads 38 and 39 complete the connection of wafer 35 to flat portions 40 and 41 of leads 36 and 37 respectively.

The dimensions of the transistor assembly shown in FIGURE 5 may be the same as FIGURE 3 except that the width of the block would be approximately 10*r*.

As mentioned previously the diode assembly and the transistor assembly will finally be encapsulated with a suitable potting compound.

Although the above described mounting block does not contain more than two slots, it is understood that a further extension of the invention may include a greater number of slots where a larger number of input and output leads are required as for example in solid state integrated circuits having a number of semiconductor and/or thin film devices.

What is claimed is:

1. A semiconductor mounting assembly comprising a block of insulating material having at least one lead receiving slot therein, a first electrically conductive lead having sufficient mass to provide good thermal conductivity disposed in a slot in said block, said slot having an entrance portion slightly greater in width than the diameter of the lead prior to deformation and an undercut portion wider than said entrance portion, the lead being pressed and deformed into said undercut portion to secure the lead in the slot and form a flat surface on the top of the lead, a semi-conductor device mounted directly on said flat surface whereby the lead itself acts as a heat sink for the semi-conductor device secured in a slot and means for electrically connecting the semi-conductor device to said second lead.

2. A diode mounting assembly comprising a block of insulating material having at least one lead receiving slot therein, a first electrically conductive lead having sufficient mass to provide good thermal conductivity disposed in a slot in said block, said slot having an entrance portion slightly greater in width than the diameter of the lead prior to deformation and an undercut portion wider than said entrance portion, the lead being pressed and deformed into said undercut portion to secure the lead in the slot and form a flat surface on the top of the lead, a diode mounted directly on said flat surface whereby the lead itself acts as a heat sink for the diode, a second lead secured in a slot and means for electrically connecting the diode to said second lead.

3. A diode mounting assembly as defined in claim 2 in which the leads are secured in opposite ends of a single slot and separated from each other.

4. A transistor mounting assembly, comprising a piece of insulating material having at least two lead receiving slots therein, a first electrically conductive lead having sufficient mass to provide good thermal conductivity disposed in a slot in said block, said slot having an entrance slightly greater in width than the diameter of the lead prior to deformation and an undercut portion wider than said entrance portion, the lead being pressed and deformed into said undercut portion to secure the lead in the slot and form a flat surface on the top of the lead, a transistor mounted directly on said flat surface whereby the lead itself acts as a heat sink for the transistor, a second lead secured in a slot in said block, a third lead secured in a slot in said block and means for electrically connecting the transistor to the second and third leads.

5. A transistor mounting assembly as defined in claim 4 wherein the second and third lead are secured at opposite ends of a single slot and separated from each other.

6. An integrated circuit mounting assembly comprising a block of insulating material having lead receiving slots therein, a plurality of electrically conductive leads, each lead being disposed in a slot in said block, at least two of said leads having sufficient mass to provide good thermal conductivity, said slot having an entrance position slightly greater in width than the diameter of the lead prior to deformation and an undercut portion wider than said entrance portion, the lead being pressed and deformed into said undercut portion to secure the lead in the slot and form a flat surface on the top of the lead, a separate solid state device mounted directly on the flat surface of the said at least two leads having good thermal conductivity whereby the lead itself acts as a heat sink for the solid state device, and means for electrically interconnecting the devices and any other leads as required.

7. A method of mounting a semiconductor device assembly including a semiconductor device, a plurality of electrically conductive leads and a block of insulating material having lead receiving slots therein, at least one of said leads having sufficient mass to provide good thermal conductivity said slot saving an entrance portion slightly greater in width than the diameter of the lead prior to deformation and an undercut portion wider than said entrance portion comprising the steps of laying each lead in a slot, deforming the said at least one lead having good thermal conductivity by applying a localized pressure thereto so as to displace some of its material into said undercut portion thereby securing the lead in the slot and forming a flat surface on the top of the lead, mounting the semiconductor device on the flat surface of said one lead and interconnecting the semiconductor device to as many other leads as required.

References Cited by the Examiner

UNITED STATES PATENTS

| | | | |
|---|---|---|---|
| 2,938,939 | 5/1960 | Malcolm | 317—101 X |
| 3,038,958 | 6/1962 | Swengel | 174—84.7 X |
| 3,235,945 | 2/1966 | Hall et al. | 29—155.5 |

OTHER REFERENCES

IBM Technical Disclosure Bulletin vol. 2, No. 1, June 1959, p. 9.

ROBERT K. SCHAEFER, *Primary Examiner.*

W. C. GARVET, J. R. SCOTT, *Assistant Examiners.*